United States Patent [19]
Self

[11] Patent Number: 6,064,214
[45] Date of Patent: May 16, 2000

[54] PERIMETER TRACE PROBE FOR PLASTIC BALL GRID ARRAYS

[75] Inventor: Bobby J. Self, Colorado Springs, Colo.

[73] Assignee: Hewlett-Packard Company, Palo Alto, Calif.

[21] Appl. No.: 08/994,186

[22] Filed: Dec. 19, 1997

[51] Int. Cl.[7] .................................................. G01R 31/02
[52] U.S. Cl. ......................... 324/754; 324/755; 324/757; 324/760
[58] Field of Search .................................. 324/754, 755, 324/756, 757, 758, 760, 761

[56] References Cited

U.S. PATENT DOCUMENTS

| | | |
|---|---|---|
| 4,317,359 | 3/1982 | Georg ......................................... 72/454 |
| 5,247,246 | 9/1993 | Van Loan et al. ........................ 324/761 |
| 5,646,542 | 7/1997 | Zamborelli et al. ..................... 324/755 |
| 5,680,057 | 10/1997 | Johnson ............................... 324/755 X |
| 5,708,222 | 1/1998 | Yonezawa et al. ................. 324/754 X |
| 5,731,709 | 3/1998 | Pastore et al. ........................... 324/760 |
| 5,825,192 | 10/1998 | Hagihara ................................. 324/757 |
| 5,859,538 | 1/1999 | Self ........................................ 324/765 |

*Primary Examiner*—Ernest Karlsen
*Assistant Examiner*—T. R. Sundaram

[57] ABSTRACT

A test probe assembly for testing integrated circuit (IC) packages mounted onto a ball grid array is described. The test probe assembly can also be used to interconnect test instrumentation to the ball grid array without removal from the circuit in which it is mounted and with a minimal impact on the performance of the circuit. Contacts on the test probe assembly make electrical contact to test traces fabricated on the top side of the ball grid array package.

18 Claims, 3 Drawing Sheets

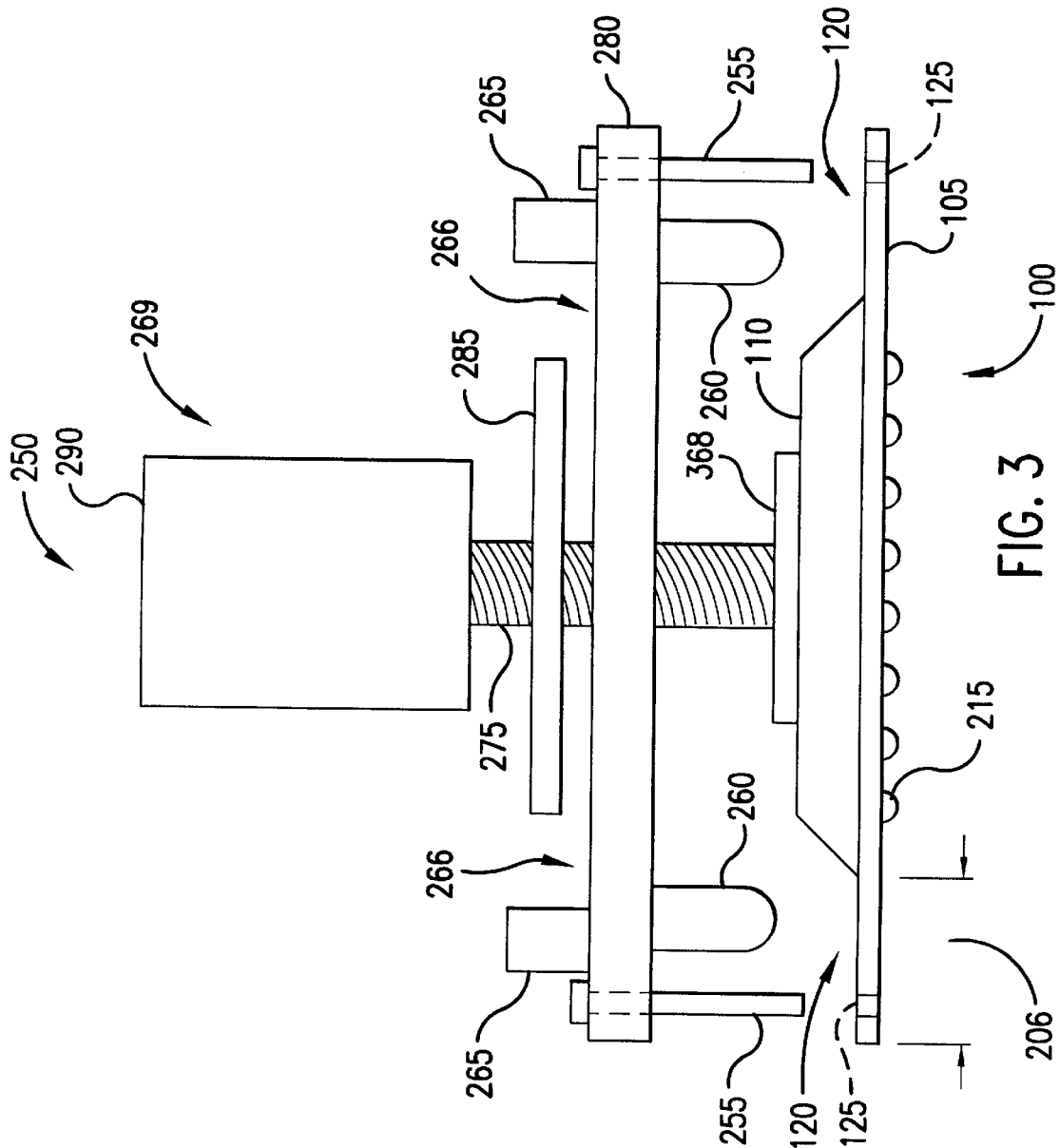

PERIMETER TRACE PROBE FOR PLASTIC BALL GRID ARRAYS

FIELD OF THE INVENTION

The present invention relates generally to electronic test instruments and more particularly to a test probe assembly for electrically connecting a ball grid array surface mount package to an electronic measurement device.

BACKGROUND OF THE INVENTION

An increasingly important package design in the surface mount technology area is the Ball grid array (BGA). BGA's offer many advantages over standard fine-pitch surface mount and pin grid array technologies. These advantages include reduced placement problems since BGAs are self-centering, reduced handling issues because there are no leads to damage, lower profile and higher interconnect density. However, significant drawbacks in BGA technology exist due to the inability to effectively test BGA packaged devices once they are configured for circuit insertion and once they are actually soldered into a circuit. In the latter instance it is especially important to be able to test the BGA device without disturbing its performance.

Electronic test instruments (e.g., oscilloscope, logic analyzer, emulator) are used to analyze various electrical aspects of integrated circuits (IC's) including voltage and current waveforms. Typically, a loaded printed circuit board is crowded with various electrical components, including multiple IC packages. Due to the close spacing of components on the board (i.e., high "board density") it is often difficult to electrically connect the IC's to the test instrument.

BGAs only make this problem worse since there are no "leads" to access for testing purposes, the balls on the BGA are small, and the balls are inaccessible. A modification of the BGA technology, the Plastic Ball Grid Array (PBGA), was made to aid in testing during fabrication. In this technology, the IC is attached to a substrate, typically a printed circuit board (PCB), which forms the bottom layer of the BGA. Traces on the PCB connect between the IC and test pads on the PCB which are large enough to be accessed by test probes connected in turn to test instruments. However, after the PBGA device has been given a final functional test, the outer portion of the PCB is sheared off leaving only a small remnant of these traces around the peripheral of the PBGA. Since most PBGA's are shipped to the customer in this condition, testing prior to insertion in a circuit and afterwards presents great difficulties. In particular, testing an inserted PBGA causes significant modification in circuit performance resulting in questionable test results.

SUMMARY OF THE INVENTION

A solution to the problem of testing Plastic Ball Grid Array (PBGA) devices after the outer portion of the Printed Circuit Board (PCB) substrate is sheared off, as well as after the PBGA is loaded onto a PCB, is to use a test probe assembly which contacts specially designed test traces on the substrate PCB of the PBGA. Using such a test probe, the PBGA can now be tested in the condition in which it is most often shipped to customers. Operation of the PBGA can also be observed as it functions in its operating environment with minimal additional hardware that could potentially degrade performance.

Contacts on the test probe assembly mate with appropriately designed conductive traces on the PBGA. Another set of contacts on the test probe assembly provide interconnection with test instrumentation. Minimal interference with circuit performance is obtained in this manner. In addition, the test probe can be easily removed and reattached as needed. The mechanism used to mechanically attach the test probe assembly to the PBGA may be left in place upon removal of the remainder of the test probe assembly, thereby facilitating replacement of the test probe assembly should that be necessary.

BRIEF DESCRIPTION OF THE DRAWINGS

FIG. 3 is another drawing of the side view of a PBGA and a test probe assembly for testing the PBGA, some contacts on the test probe assembly having been omitted for clarity.

DESCRIPTION OF THE PREFERRED EMBODIMENT

Figure 1:
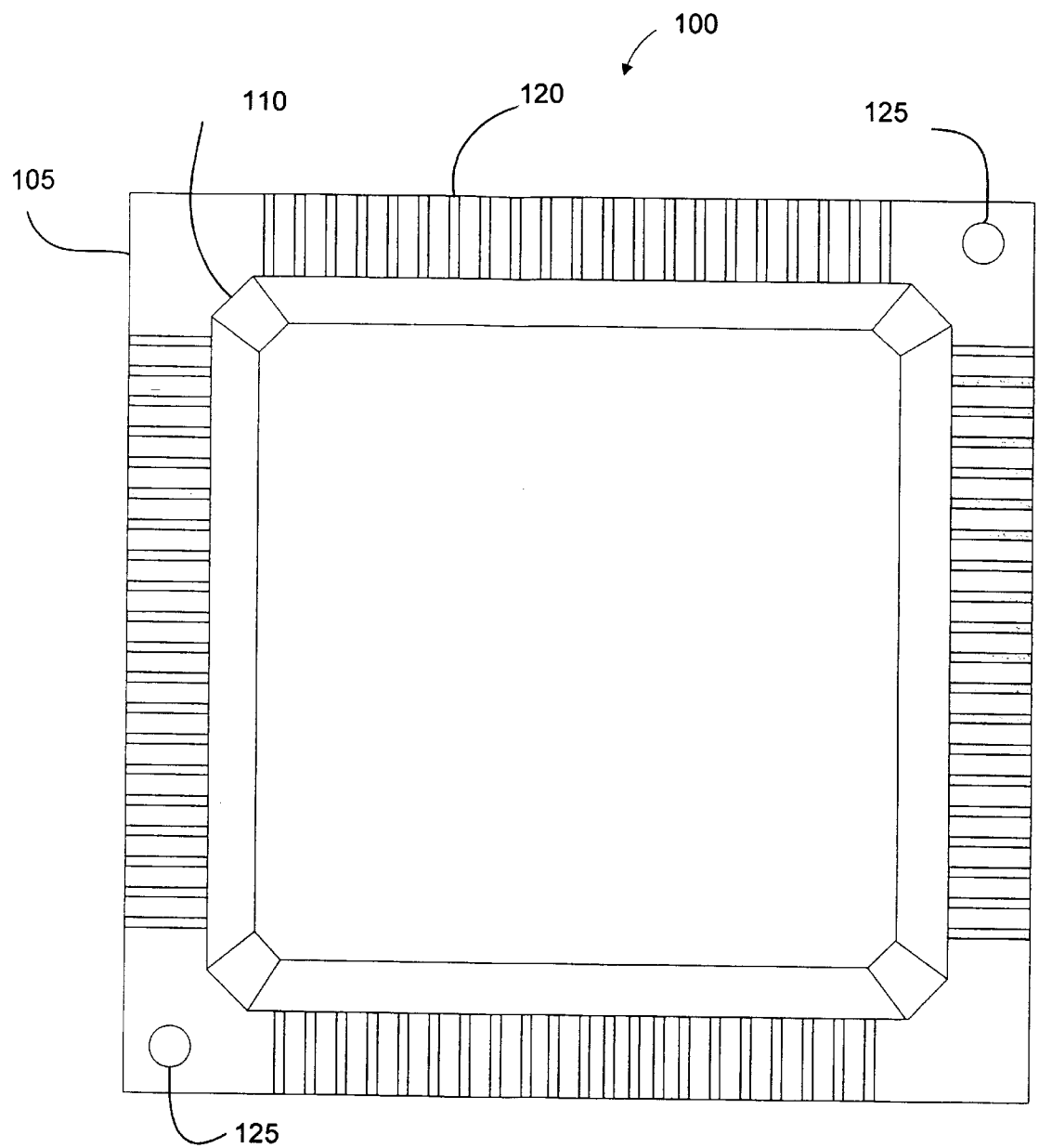
FIG. 1 is a drawing of the top view of a Plastic Ball Grid Array (PBGA).

In the following detailed description and in the several figures of the drawings, like elements are identified with like reference numerals.

FIG. 1 is a drawing of the top view of an electronic device 100 which in a representative embodiment is a Plastic Ball Grid Array (PBGA) device. The electronic device 100 consists of an electronic component (not shown), such as an integrated circuit, mounted on a substrate 105 which for this embodiment is a printed circuit board (PCB). A cover 110 mounted over the electronic component and attached to the substrate 105 aids in protecting the electronic component from damage.

Figure 2:
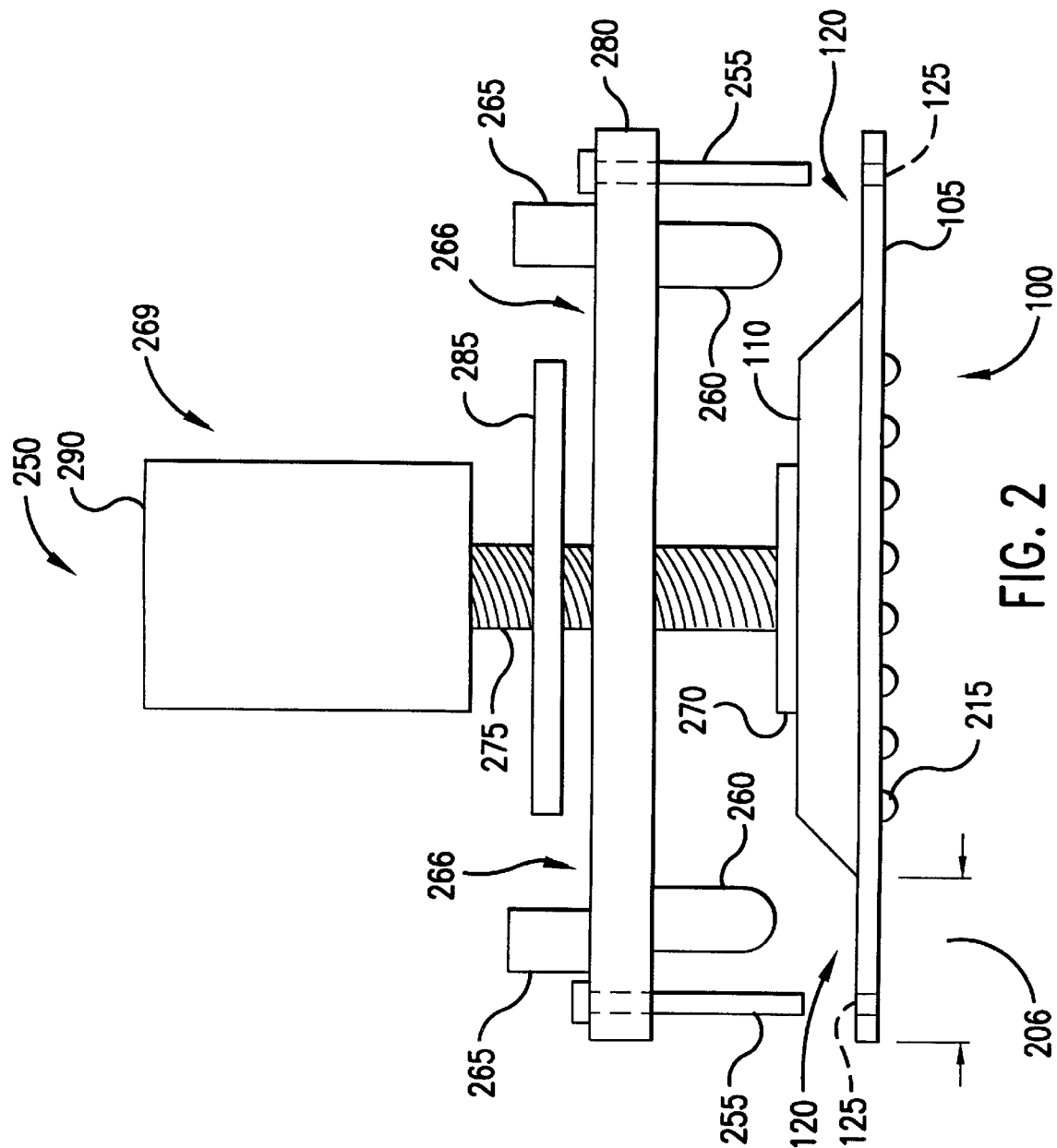
FIG. 2 is a drawing of a side view of a PBGA and a test probe assembly for testing the PBGA, some contacts on the test probe assembly having been omitted for clarity.

FIG. 2 is a drawing of the side view of the electronic device 100 of FIG. 1 and a test probe assembly 250. The electronic device 100 has solder balls 215, also referred to herein as circuit insertion contacts 215, connected to one or more integrated circuits mounted to the substrate 105 under the cover 110. In use, the solder balls 215 typically are bonded to a printed circuit board containing other electrical components. The test probe assembly 250 contains at least one alignment pin 255 which inserts into alignment holes 125 in the substrate 105. FIG. 1 shows two alignment holes 125, thus requiring two matching alignment pins 255. However, representative embodiments are not limited to a specific number of alignment holes and pins, and other alignment schemes are also possible.

In the representative embodiment of FIG. 2, a first contact 260 makes electrical contact with a test trace 120, also referred to herein as a test point 120 when connected to the electronic device 100. Test traces 120 are also multiply shown in FIG. 1. The test trace 120 is fabricated on the surface of the substrate 105 of the electronic device 100 within an edge width distance 206 from the outer edge of the substrate 105. The edge width distance 206 must be large enough to insure electrical contact of the first contact 260 with the test trace 120. An attachment mechanism 269 is used to provide sufficient force to insure a reliable electrical contact between the test trace 120 and the first contact 260. The attachment mechanism 269 comprises an attachment plate 270 which is attached to the cover 110 of the electronic device 100. The attachment plate 270 is attached to a screw 275. In another embodiment, the attachment plate 270 could be omitted and the screw 275 attached directly to the cover 110. Such attachments could be made by bonding with a glue. The shaft of the screw 275 passes through a hole in the base 280 of the test probe assembly 250. A spacer 285 then inserts over the end of the screw 275, and a nut 290 is screwed onto the threads of the screw 275. The force necessary to obtain a reliable electrical contact between the test trace 120 and the first contact 260 is implemented by tightening the nut 290 onto the screw 275. The nut 290 pushes the spacer 285 onto the base 280 which in turn forces the first contacts 260 into electrical contact with the test traces 120. In another embodiment, the spacer 285 is eliminated, with the nut 290 performing the same function as the spacer 285 by pushing against the base 280.

Other test probe assemblies 250 may be attached as necessary to other electronic devices 100 in any given circuit. In order to further reduce operational effects on the circuit of the test probe assemblies 250, the test probe assembly 250 may be removed once the electronic device 100 has been tested. An alternative technique is to remove all components of the test probe assembly 250, with the exception of the attachment plate 270 and the screw 275 since the attachment plate was bonded to the cover 110 and to the screw 275.

Base 280 in this example embodiment is a printed circuit board with conductive traces 266, also referred to herein as conductors 266, interconnecting the first contact 260 with a second contact 265. To perform a test on the electronic device 100, second contacts 265 are connected to a test machine (not shown).

Two sets of first contacts 260 and second contacts 265, which would otherwise be placed near the front edge and near the back edge of base 280 in FIG. 2, have been omitted for clarity. Inclusion of these contacts would have obscured the view of the attachment plate 270, the screw 275, and the spacer 285.

FIG. 3 is another drawing of the side view of the electronic device 100 of FIG. 1 and the test probe assembly 250. Once again, two sets of first contacts 260 and second contacts 265, which would otherwise be placed near the front edge and near the back edge of base 280 in FIG. 2, have been omitted for clarity. Inclusion of these contacts in FIG. 3 would have obscured the view of an attachment connector 368, the screw 275, and the spacer 285. In the representative embodiment of FIG. 3, the attachment connector 368 is a nut bonded or otherwise attached to the cover 110 of the electronic device 100. The screw 275 inserts into the attachment connector 368. In another embodiment, the attachment connector 368 could be an integral part of the cover 110. Once again, the force necessary to obtain a reliable electrical contact between the test trace 120 and the first contact 260 is implemented by tightening the nut 290 onto the screw 275. The nut 290 pushes the spacer 285 onto the base 280 which in turn forces the first contacts 260 into electrical contact with the test traces 120. In another embodiment, the spacer 285 is eliminated, with the nut 290 performing the same function as the spacer 285 by pushing against the base 280.

A primary advantage of the test probe assembly 250 over prior test probes is that the electronic device 100 can be tested in the circuit that it is designed to operate. Thus, the test probe assembly 250 is a useful development tool and greatly enhances the trouble shooting of poorly operating or non-performing circuits. Such electronic devices 100 can also be easily tested following fabrication and prior to circuit insertion. A further advantage is that the test probe assembly 250 can be easily attached and removed from the electronic device 100 without the necessity of soldering and un-soldering leads.

What is claimed is:

1. A test probe assembly for electrically connecting a ball grid array surface mount package to an electronic test instrument, comprising:
   (a) a base;
   (b) a first single contiguous contact mechanically mounted on the base and disposed such that it makes electrical contact with a test point on a first side of the ball grid array surface mount package when the base is registered above the electronic device, said ball grid array surface mount package having a circuit insertion contact on a second side;
   (c) a second contact electrically connected to the first single contiguous contact, said second contact connectable to the electronic test instrument; and
   (d) an attachment mechanism that urges the first single contiguous contact against the test point by drawing the base toward the ball grid array surface mount package when the base is registered above the ball grid array surface mount package and when a force directed toward the ball grid array surface mount package is applied to said base.

2. The test probe assembly as in claim 1, wherein:
   the ball grid array surface mount package is a plastic ball grid array.

3. The test probe assembly as in claim 1 wherein the attachment mechanism comprises:
   a screw bondable to the ball grid array surface mount package and extending through a hold in the base; and
   a nut which applies force to the base when the threads of the nut have sufficiently engaged the threads of the screw to alone achieve electrical contact between the first single contiguous contact and the test point.

4. The test probe assembly as in claim 3, wherein:
   the ball grid array surface mount package is a plastic ball grid array.

5. The test probe assembly as in claim 3 wherein the attachment mechanism further comprises:
   a spacer having a hole through which the screw extends and located between the base and the nut.

6. The test probe assembly as in claim 5, wherein:
   the ball grid array surface mount package is a plastic ball grid array.

7. A test probe assembly as in claim 1 wherein the attachment mechanism comprises:
   an attachment plate bondable to the ball grid array surface mount package;
   a screw bondable to the attachment plate and extending through a hole in the base; and
   a nut which applies force to the base when the threads of the nut have sufficiently engaged the threads of the screw to alone achieve electrical contact between the first single contiguous contact and the test point.

8. The test probe assembly as in claim 7, wherein:
   the ball grid array surface mount package is a plastic ball grid array.

9. The test probe assembly as in claim 7 wherein the attachment mechanism further comprises:
   a spacer having a hole through which the screw extends and located between the base and the nut.

10. The test probe assembly as in claim 9, wherein:
    the ball grid array surface mount package is a plastic ball grid array.

11. The test probe assembly as in claim 1 wherein the attachment mechanism comprises:

a screw capable of mating with an attachment connector mounted on the ball grid array surface mount package, said screw extending through a hole in the base; and a nut which applies force to the base when the threads of the nut have sufficiently engaged the threads of the screw to alone achieve electrical contact between the first single contiguous contact and the test point.

12. The test probe assembly as in claim 11, wherein:

the ball grid array surface mount package is a plastic ball grid array.

13. The test probe assembly as in claim 11 wherein the attachment mechanism further comprises:

a spacer having a hole through which the screw extends and located between the base and the nut.

14. The test probe assembly as in claim 13, wherein:

the ball grid array surface mount package is a plastic ball grid array.

15. The test probe assembly as in claim 1 wherein the attachment mechanism comprises:

a screw capable of mating with an attachment connector integral to the ball grid array surface mount package, said screw extending through a hole in the base; and a nut which applies force to the base when the threads of the nut have sufficiently engaged the threads of the screw to alone achieve electrical contact between the first single contiguous contact and the test point.

16. The test probe assembly as in claim 15, wherein:

the ball grid array surface mount package is a plastic ball grid array.

17. The test probe assembly as in claim 15 wherein the attachment mechanism further comprises:

a spacer having a hole through which the screw extends and located between the base and the nut.

18. The test probe assembly as in claim 17, wherein:

the ball grid array surface mount package is a plastic ball grid array.

* * * * *